(12) United States Patent
Klapper et al.

(10) Patent No.: US 11,570,891 B2
(45) Date of Patent: Jan. 31, 2023

(54) ELECTRICAL CONNECTION ON A TEXTILE CARRIER MATERIAL

(71) Applicants: ADAPTIVE REGELSYSTEME GESELLSCHAFT M.B.H., Salzburg (AT); TEXIBLE GMBH, Dornbirn (AT); "ZAZA" TEXTILLÖSUNGEN GMBH, Koblach (AT)

(72) Inventors: Ulrich Klapper, Rankweil (AT); Thomas Fröis, Sulz (AT); Monika Repnik-Hotz, Hohenems (AT)

(73) Assignees: ADAPTIVE REGELSYSJEME GESELLSCHAFT M.B.H., Salzburg (AT); TEXIBLE GMBH, Dornbirn (AT); "ZAZA" TEXTILLÖSUNGEN GMBH, Koblach (AT)

( * ) Notice: Subject to any disclaimer, the term of this patent is extended or adjusted under 35 U.S.C. 154(b) by 0 days.

(21) Appl. No.: 17/295,852

(22) PCT Filed: Nov. 15, 2019

(86) PCT No.: PCT/EP2019/081481
§ 371 (c)(1),
(2) Date: May 20, 2021

(87) PCT Pub. No.: WO2020/104323
PCT Pub. Date: May 28, 2020

(65) Prior Publication Data
US 2022/0022313 A1  Jan. 20, 2022

(30) Foreign Application Priority Data
Nov. 20, 2018 (AT) .............................. A 51018/2018

(51) Int. Cl.
*H05K 1/03* (2006.01)
*H01R 12/59* (2011.01)
*H05K 3/36* (2006.01)

(52) U.S. Cl.
CPC .......... *H05K 1/038* (2013.01); *H01R 12/592* (2013.01); *H05K 3/363* (2013.01); *H05K 2201/029* (2013.01); *H05K 2201/0281* (2013.01)

(58) Field of Classification Search
CPC ...... H05K 1/038; H05K 1/0353; H05K 1/036; H05K 1/0366; H05K 1/0373
See application file for complete search history.

(56) References Cited

U.S. PATENT DOCUMENTS

2003/0211797 A1* 11/2003 Hill ...................... H05K 1/189
442/205
2004/0244193 A1  12/2004 Jung et al.
(Continued)

FOREIGN PATENT DOCUMENTS

| CN | 108035175 A | 5/2018 |
| CN | 108517605 A | 9/2018 |

(Continued)

*Primary Examiner* — Jeremy C Norris
(74) *Attorney, Agent, or Firm* — Dykema Gossett PLLC (57) ABSTRACT

Various embodiments of the present disclosure are directed to electrically conductive connection between a first electrically conductive element and a second electrically conductive element on a textile carrier material. In one example embodiment, the electrically conductive connection includes an electrically conductive thermal transfer adhesive arranged on the carrier material and creates an electrically conductive connection between the first conductive element and the second conductive element. The electrically conductive connection is positioned in electrically conductive contact with the first conductive element and the second conductive element.

17 Claims, 2 Drawing Sheets

(56) References Cited

U.S. PATENT DOCUMENTS

| | | |
|---|---|---|
| 2005/0095406 A1 | 5/2005 | Gunzel et al. |
| 2008/0083721 A1 | 4/2008 | Kaiserman et al. |
| 2015/0041302 A1 | 2/2015 | Okumura et al. |

FOREIGN PATENT DOCUMENTS

| | | |
|---|---|---|
| EP | 3100677 A1 | 7/2016 |
| WO | 9960829 A2 | 11/1999 |
| WO | 03059026 A1 | 7/2003 |
| WO | 2016081689 A2 | 5/2016 |

* cited by examiner

ELECTRICAL CONNECTION ON A TEXTILE CARRIER MATERIAL

CROSS-REFERENCE TO RELATED APPLICATIONS

This application is a national stage filing based upon International PCT Application No. PCT/EP2019/081481, filed 15 Nov. 2019, which claims the benefit of priority to Austria application No. A 51018/2018, filed 20 Nov. 2018.

BACKGROUND

The present invention relates to an electrically conductive connection between a first electrically conductive element and a second electrically conductive element on a textile carrier material, and to a patch comprising thermal transfer adhesive for producing an electrically conductive connection, and to a method for producing such an electrically conductive connection.

Intelligent clothing, or smart textiles, are garments comprising integrated electronics or electrical systems, that are sometimes not visible from the outside. Almost any functions can be implemented with the electronics or electrical systems, such as luminous clothing, play functions (e.g., laser tagging), monitoring vital parameters (e.g., heart rate, blood pressure, body temperature, breathing rate, electrocardiogram (ECG), etc.), safety functions (e.g., electrical voltage detection, fall detectors, etc.), communication, multimedia, etc. In many of these applications it is necessary to interconnect electrical conductors on smart clothing, for example to connect a light-emitting diode to conductors that carry the current from another point to the pins of the light emitting diode. Another example is connecting a sensor to a control unit. It is also often necessary to connect the electronics to an electrical power supply. In addition, however, a mechanical fastening or connection often has to be created.

Outside of the smart textile industry, electrical connections between wires and electrical contacts are often produced by soldering or crimp connections. However, these connections are not optimal in smart textiles for various reasons: the methods are completely new for the textile industry; the methods are not resistant to washing processes to which textiles are subjected; and the methods are relatively complex to carry out. Apart from this, it is understandably unfavorable to form a soldering point on a textile material, since this can easily damage or visibly impair the textile material. Due to the size of such connections on intelligent garments, crimp connections are also rather unfavorable, both in terms of appearance and comfort.

Thermal transfer methods, also known as hot-melt adhesive methods, are known in the textile industry. Meshes or fleeces made of thermal transfer material, for example PLATAMID (from Arkema) or DYNACOLL S (from Evonik), are used, which can be placed between two layers of fabric. If the package consisting of the upper fabric, the thermal transfer mesh and the lower fabric is briefly heated and pressed, this can be achieved using an iron or a thermal transfer press, the thermal transfer mesh partially melts and the two fabrics are connected to one another, in a long-lasting and process-reliable manner, after the thermal transfer mesh has hardened. However, such methods are unsuitable for electrical connections because the materials involved do not have electrically conductive properties.

A method is known from EP 1 489 696 A2 in which insulated conductors which are stripped only in places (lengthways or only at the end faces) are mechanically fixed and also electrically connected to a textile woven fabric by means of electrically conductive adhesives. Conventional adhesives but also silver-filled epoxy resin are proposed for this purpose. Working with liquid adhesives or even casting compounds in sewing shops appears to be extremely complex. The connections produced using these methods may not be process-reliable enough for everyday textile use.

From WO 2005/045110 A1 it is known how insulated conductors can be applied and fixed to textile materials using adhesive tapes. The invention presented also works with thermal transfer adhesives. However, the electrical connection at the end of the conductor is not explained and only a "connector" at the end of the conductor is mentioned.

Methods are also known in which electrical conductors are applied to textile carrier materials by means of plotters or various printing processes.

It is therefore an object of the present invention to produce a simple and secure connection between two or more electrical conductors on a textile carrier material.

SUMMARY OF THE INVENTION

According to the invention, the object is achieved by arranging an electrically conductive thermal transfer adhesive on the carrier material to produce the electrically conductive connection between the first conductive element and the second conductive element, which thermal transfer adhesive is in electrically conductive contact with the first conductive element and the second conductive element. To produce the electrical connection, the first and second conductive elements are arranged on the carrier material, an electrically conductive thermal transfer adhesive is arranged in the region of the first and second conductive element, and the thermal transfer adhesive is melted under pressure, such that the liquid thermal transfer adhesive at least partially surrounds the first and second conductive element and connects to the carrier material, as a result of which the first conductive element and the second conductive element are electrically connected to one another via the thermal transfer adhesive after the thermal transfer adhesive has hardened. By using a thermal transfer adhesive that has been made electrically conductive, the thermal transfer method, which is technically very easy to control in the field of textiles, can be used to produce the electrical connection. Since the thermal transfer adhesive generally has no adhesive properties at normal room temperatures, it can also be processed easily and cleanly, which is particularly advantageous for textiles. At the same time, the conductive elements are also mechanically fixed to the textile carrier material by means of the thermal transfer adhesive. In this way, two fundamental problems in conjunction with electrical connections on textile garments can be solved in one work step.

A flat patch is particularly advantageously provided, the thermal transfer adhesive being provided between the carrier material and the flat patch and the ends of the conductive elements being arranged in the region of the thermal transfer adhesive between the carrier material and the flat patch. To produce the electrical connection, a patch having an electrically conductive thermal transfer adhesive applied to a side facing the carrier material or a patch having an adhesive patch made of electrically conductive thermal transfer adhesive between the patch and the carrier material is used, the patch being applied to the end of the first conductive element and of the second conductive element and being placed on the carrier material before the thermal transfer adhesive is melted under pressure in order to produce the electrical connection. Such a patch can be handled easily, for example cut to size as desired and placed on the carrier material, which further simplifies the production of the electrical connection and renders it inexpensive. The processing can then be carried out very easily and quickly as one work step in textile production by arranging the required conductive elements on a piece of textile carrier material (e.g., fabric) and then electrically connecting and mechanically fixing said conductive elements in a single work step using a patch in a thermal transfer press by means of a thermal transfer method.

The possibilities of producing electrical connections can be extended if the flat patch is designed to be electrically conductive on the side facing the thermal transfer adhesive. The patch itself can thus act as a conductive element. This is particularly advantageous if the flat patch is designed to be electrically conductive on the side facing away from the carrier material and the electrically conductive side of the patch facing the carrier material is connected in an electrically conductive manner to the side of the patch facing away from the carrier material. This makes it possible to produce electrical contact with the electrical connection from the outside as well. The patch can thus act as a contactable electrode on the carrier material. If two such patches are pressed against two poles of a battery, an electrical circuit in the textile can be easily supplied with electrical energy, for example.

In order to electrically insulate the produced electrical connection to the outside, a region which extends continuously over the circumference of the patch can be provided with an electrically non-conductive thermal transfer adhesive on the outer edges of the patch. Using the thermal transfer method, both the electrically conductive thermal transfer adhesive and the surrounding electrically non-conductive thermal transfer adhesive are melted and applied, which greatly simplifies the production of the electrical insulation to the outside. In this context, it is advantageous if the patch is made of waterproof material and applied to a carrier material which is waterproof (at least in the region of the electrical connection). If an electrically conductive thermal transfer adhesive is now applied in the middle of the patch as intended, whereas an electrically non-conductive thermal transfer adhesive is applied to the edge of the patch, a waterproof, electrically conductive region is created under the patch after thermal transfer pressing. However, as required, the electrically non-conductive thermal transfer adhesive does not have to be provided over the entire circumference.

In a particularly advantageous embodiment, the second conductive element is designed as a flat patch and the patch has at least three regions on the side facing the carrier material, a first and a second region being provided with electrically conductive thermal transfer adhesive and a third region being provided with electrically non-conductive thermal transfer adhesive. Such a design of the patch allows the simple implementation of circuits by means of a suitable design of the conductive and non-conductive regions of thermal transfer adhesive. For this purpose, it is advantageous if the first and the second electrically conductive region are electrically insulated from one another by the third electrically non-conductive region.

An electrical circuit comprising an electrical or electronic component can be easily implemented if at least one electronic or electrical component comprising at least one first and second connection pin is arranged on the patch, the first connection pin being connected to the first electrically conductive region in an electrically conductive manner and the second connection pin being connected to the second electrically conductive region in an electrically conductive manner. In this way, a plurality of components can also be placed on the patch, which can also be electrically connected easily by means of the arrangement of the conductive and non-conductive regions of thermal transfer adhesive on the patch.

The produced electrical connection can also be electrically insulated to the outside by providing a fourth region with an electrically non-conductive thermal transfer adhesive on the outer edges of the patch which extends continuously over the circumference of the patch. This design can also be combined with a waterproof patch and a carrier material which is waterproof (at least in the region of the electrical connection). As required, the electrically non-conductive thermal transfer adhesive does not have to be provided over the entire circumference.

The production of the electrical connection is further simplified if electrical insulation of at least one conductive element in the region of the electrically conductive thermal transfer adhesive is at least partially melted by means of the thermal transfer method. This means that a conductive element provided with insulation does not have to be stripped to produce the electrical connection. For this purpose, an electrically conductive wire, which makes electrical contact with the conductive element, is advantageously arranged substantially transversely to the conductive element, in the conductive thermal transfer adhesive between the carrier material and the at least one conductive element comprising insulation and/or between the at least one conductive element comprising insulation and a patch. This allows the contact resistance between the conductive element and the conductive thermal transfer adhesive to be reduced.

The electrically conductive and/or electrically non-conductive thermal transfer adhesive can be applied to the patch in a particularly simple, precise and clean manner by means of a printing method. Screen printing methods, rotary printing methods, digital printing methods, spacer or slot die methods or other methods that achieve the effect can be used. It can also be advantageous if an electrically conductive thermal transfer adhesive is at least partially overprinted with an electrically non-conductive thermal transfer adhesive (or vice versa), which results in more possibilities for producing circuits.

BRIEF DESCRIPTION OF THE DRAWINGS

The present invention is described in greater detail in the following with reference to FIGS. 1 to 7, which show advantageous embodiments of the invention by way of example, schematically and in a non-limiting manner. In the drawings.

DETAILED DESCRIPTION

Textiles (textile materials) in the context of the invention comprise textile raw materials or non-textile raw materials which have been processed into flat or three-dimensional textile structures by various methods. Textiles made of textile raw materials can also contain non-textile raw materials. Textile raw materials can include natural fibers (of vegetable or animal origin) or synthetic fibers (made of plastics material), such as cotton, wool, polyester, or polyamide. Non-textile raw materials can also be, e.g., leather, feathers, scales or metals. Typical flat arrangements are woven fabrics, knitwear, stitch fabrics, knitted fabrics, braided fabrics, stitch-bonded fabrics, nonwovens or felts, which are mostly in the form of textile webs. Three-dimensional arrangements can be, for example, tubular structures, again in the form of woven fabrics, knitwear, stitch fabrics, knitted fabrics, braided fabrics, stitch-bonded fabrics, nonwovens or felts. A textile material is sufficiently flexible to be processed to produce a garment or to be able to be used in a garment. Completely rigid materials or rigid materials that limit the mobility of the person wearing the garment too much are not suitable for this purpose.

The invention is intended to produce an electrical connection on a textile carrier material 11, between at least two electrically conductive elements 31, 32 for conducting an electrical current. An electrically conductive element 31, 32 can be an elongate conductor such as a wire, a core, a stranded wire, etc., or a flat conductor, e.g., an electrode. The electrically conductive element 31, 32 is made of an electrically conductive material, for example copper or aluminum, or at least partially coated on the surface of a carrier element with an electrically conductive material, for example copper, aluminum, gold, silver, etc. Yarns coated in an electrically conductive manner or any materials from the group of conductive substances can also be selected, e.g., conductive metal wires, metal fiber yarns, conductive plastics material, carbon materials, or combinations or mixtures thereof. If coated, the carrier element can be made of a non-conductive material such as paper, plastics material, textile, metal, etc. Composite materials can also be used for an electrically conductive element 31, 32. A conductive element 31, 32 can also be part of the textile carrier material 11, for example a metal wire which is woven or incorporated into the textile material or a fiber coated in an electrically conductive manner in a woven or knitted fabric.

An electrically conductive thermal transfer adhesive is provided to produce the electrically conductive connection. A thermal transfer adhesive is an adhesive in the form of a thermoplastic, which at normal operating temperatures of an intelligent garment, typically between −20° C. and 60° C., has a solid state and is usually non-adhesive (i.e., has no adhesive properties). From a certain melting temperature (reaction temperature), typically between 125 and 250° C., the thermal transfer adhesive softens until it is flowable and also develops adhesive properties (thus becoming adhesive). When cooling, the thermal transfer adhesive hardens again and solidifies again, causing the thermal transfer adhesive to lose its adhesiveness. Adhesive properties can also begin to develop below the melting temperature. Two adhesive partners that are to be connected to one another by the thermal transfer adhesive are pressed together by pressure when the thermal transfer adhesive has melted, such that the thermal transfer adhesive connects to the two adhesive partners. After the thermal transfer adhesive has hardened, a secure and permanent connection is formed between the two adhesive partners.

To produce the electrical connection, the thermal transfer adhesive can be applied to the carrier material 11 and/or a conductive element 31, 32, for example applied in paste form or extruded on, or can be in the form of a mesh, woven fabric or film and can be applied as an adhesive patch at the required point of the carrier material 11. In the latter case, such a mesh, woven fabric or film can also be laminated with a flat conductive element 31, 32, i.e., connected thereto by means of a suitable adhesive.

In order to make such a thermal transfer adhesive electrically conductive, an electrically conductive material, for example graphite powder or similar conductive substances, can be added to the thermal transfer adhesive. For example, a commercially available thermal transfer material can be in the form of granules for an extruder. When the thermal transfer material is extruded to form a film or a fiber, the electrically conductive material, which can be in powder or granular form, can then be added in order to make the extruded thermal transfer adhesive electrically conductive. A mesh or a woven fabric made of thermal transfer adhesive can then be produced from a fiber produced in this way. A powdered thermal transfer material can, e.g., be mixed with the electrically conductive material in order to produce a paste of thermal transfer adhesive therefrom. A thermal transfer material in the form of a paste can also be mixed with an electrically conductive material in the form of a powder or paste in order to make the thermal transfer material electrically conductive. Exemplary brands and manufacturers of thermal transfer materials include, inter alia, PLATAMID (from Arkema), DYNACOLL S (from Evonik) or TUBILUX TD 90 NF (from CHT). With a suitable choice of material for the thermal transfer material and the electrically conductive material, electrical connections having resistances of less than 10 ohms, preferably in the milliohm range, are obtained with a thermal transfer adhesive produced from said material.

In the following, various embodiments for producing an electrically conductive connection on a textile carrier material 11 by means of an electrically conductive thermal transfer adhesive are described.

Figure 1:
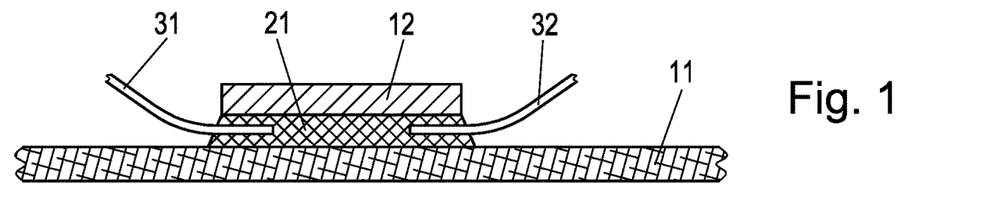
FIG. 1 shows a section through a patch which electrically connects two conductors on a textile carrier material

In FIG. 1, a textile or non-textile patch 12 is applied to a textile carrier material 11 by means of electrically conductive thermal transfer adhesive 21. The patch 12 can be made of a textile material, or of plastics material or metal. The patch 12 is a flat piece of material large enough to cover at least the region of the electrical connection, and is generally substantially smaller than the carrier material 11. In this embodiment, the conductive elements 31, 32 are in the form of wires and are at least partially not insulated in the region of the thermal transfer adhesive 21 between the patch 12 and the carrier material 11. Completely uninsulated wires can also be used as conductive elements 31, 32, or the wires are at least partially stripped before adhesion in the region of thermal transfer adhesive 21. The electrically conductive thermal transfer adhesive 21 produces an electrical connection between the conductive elements 31, 32, even if the ends of the wires do not touch.

To produce such an electrical connection, the conducting elements 31, 32 (in this case wires) can be placed on the carrier material 11 with at least partially stripped ends. The patch 12 is then placed on the ends of the conductive elements 31, 32 and is coated with an electrically conductive thermal transfer adhesive on the side facing the carrier material 11, for example by extrusion, lamination, paste application, etc. The patch 12 is then pressed against the carrier material 11 under pressure and heat (above the melting temperature of the thermal transfer material used). As an alternative and equivalent, instead of a coating with thermal transfer adhesive 21, a separate adhesive patch (as a mesh, fabric, film, etc.) could also be inserted between the patch 12 and the carrier material 11. In this embodiment, patch 12 could also be omitted entirely. As a result, the thermal transfer adhesive melts and flows around the conductive elements 31, 32 and also connects to the carrier material 11 and optionally also to the patch 12. After the thermal transfer adhesive has hardened, a secure, permanent electrical connection is produced between the conductive elements 31, 32. At the same time, the conductive elements 31, 32 are mechanically fixed to the carrier material 11 in a secure permanent manner.

Figure 2:
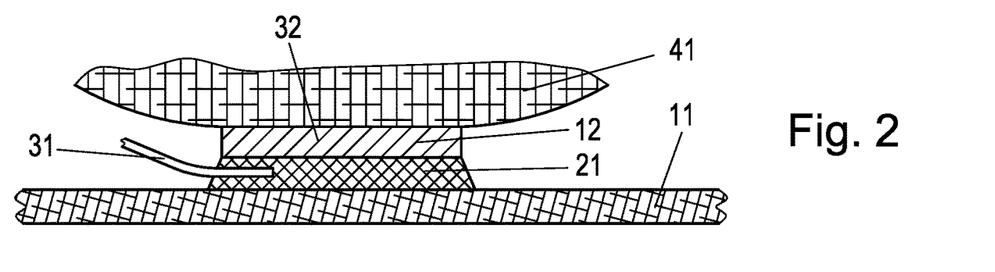
FIG. 2 shows a section through a conductive patch electrically connecting a conductor in the form of a wire to an object outside the textile.

In FIG. 2, the patch 12 itself forms a conductive element 31. For this purpose, the patch 12 itself is electrically conductive. Suitable materials for such an electrically conductive patch 12 are known and it could be, e.g., conductive silicone, but also a woven metal fabric or a woven fabric made of a metallized yarn. The patch 12 could also be a metal piece, for example made of copper or aluminum, or a carrier element coated in an electrically conductive manner. In this case, the conductive element 32 is flat and forms, e.g., an electrode. As in FIG. 1, the conductive thermal transfer adhesive 21 produces an electrical connection, but now between the conductive element 31 and the flat conductive element 32, which is in the form of a patch 12. If an object 41 is now pressed against the conductive element 32, an electrically conductive connection is produced from the object 41 to the conductive element 31. For this purpose, the patch 12 is designed to be electrically conductive in the region of the thermal transfer adhesive 21 and is connected in an electrically conductive manner to an electrically conductive surface region on a surface of the patch 12 facing away from the carrier material 11. This can be implemented most simply if the entire surface of the patch 12 or the entire patch 12 is electrically conductive. The object 41 can take many shapes, for example, it can be the contact of a battery, which would then mean that electronics in a smart textile could be supplied with energy. However, the checking of the contact with the object 41 could also be checked, such that a smart textile can sometimes also detect in a very technical application whether contact is properly made with the object 41.

The patch 12 could also be made of a magnetically conductive material and the object 41 could comprise a magnet, such that an electrical and simultaneous mechanical coupling can be produced between the textile carrier material 11 and the object 41. The object 41, e.g., a battery or a battery box, could thus be mechanically "snapped" onto a textile by means of magnets and at the same time produce an electrical connection.

The human body can also conduct electrical currents. The object 41 could therefore also be a naked body part of a person. An electrical voltage can then be tapped from a piece of skin as an object 41 by means of the conducting element 32. For example, an ECG (electrocardiogram) contact, or another contact for detecting a physiological variable of a person that can be detected via the skin, can be implemented by means of the conductive element 32.

As in the embodiment according to FIG. 1, the thermal transfer adhesive 21 can either be applied to the patch 12 or used as a separate adhesive patch. The electrically conductive connection can be produced as in the embodiment according to FIG. 1, i.e., again by means of pressure and heat.

Figure 3:
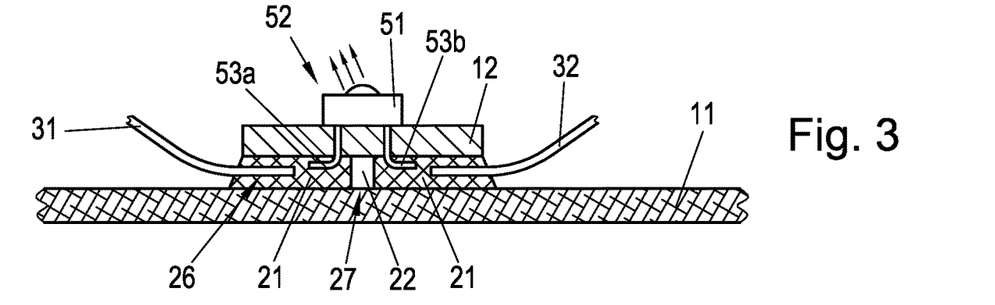
FIG. 3 shows a section through a patch comprising an integrated light-emitting diode.

FIG. 3 shows a light-emitting diode 51 as an electronic component 52 which is integrated into a patch 12. For this purpose, the connection pins 53*a*, 53*b* of the light-emitting diode 51 protrude through the patch 12 on the side facing the carrier material 11. If the patch 12 is printed from behind, for example by means of a screen printing process, before finally being fitted on the textile carrier material 11, such that regions 26 comprising conductive thermal transfer adhesive 21 are produced, separated from at least one region 27 comprising non-conductive thermal transfer adhesive 22, a plurality of electrical connections can be produced at the same time. In the embodiment shown, the electrically conductive element 31 is connected to the first connection pin 53*a* of the light-emitting diode 51 by means of a conductive thermal transfer adhesive 21 and a second electrically conductive element 32 is connected to the second connection pin 53*b* of the light-emitting diode 51 via the second region of the conductive thermal transfer adhesive 21, producing two separate electrical connections. The patch 12 comprising the light-emitting diode 51, or another electronic or electrical component, and the various regions 26, 27 made of conductive 21 and non-conductive 22 thermal transfer adhesive is a de facto iron-on light-emitting diode 51.

Since the various regions 26, 27 of a thermal transfer adhesive 21, 22 can be applied by means of screen printing, structures of almost any complexity are conceivable. In doing so, an electrically conductive thermal transfer adhesive can also be at least partially overprinted with an electrically non-conductive thermal transfer adhesive, or vice versa. Entire electronic circuits comprising various electronic components (diodes, transistors, etc.) and electrical components (resistors, capacitors, inductors, etc.) on the patch 12 could thus be implemented. Components comprising more than two connection pins could also be connected in this way or integrated into an electrical circuit. A patch 12 comprising printed structures thus becomes the printed circuit board of the smart textile industry. Like a printed circuit board, a patch 12 could be equipped, before the thermal transfer method for producing the electrical connections, by means of an automatic placement machine with the components required and then placed on the carrier material 11 in the correct alignment with the conductive elements 31, 32.

Figure 5:
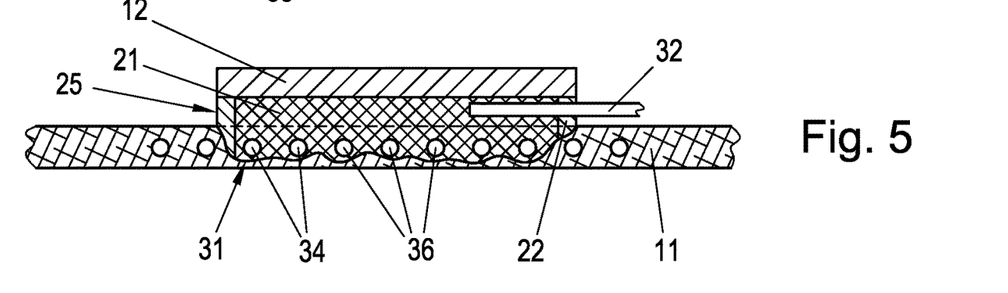
FIG. 5 shows a section through a patch comprising electrically conductive fibers in the textile carrier material.
Figure 7:
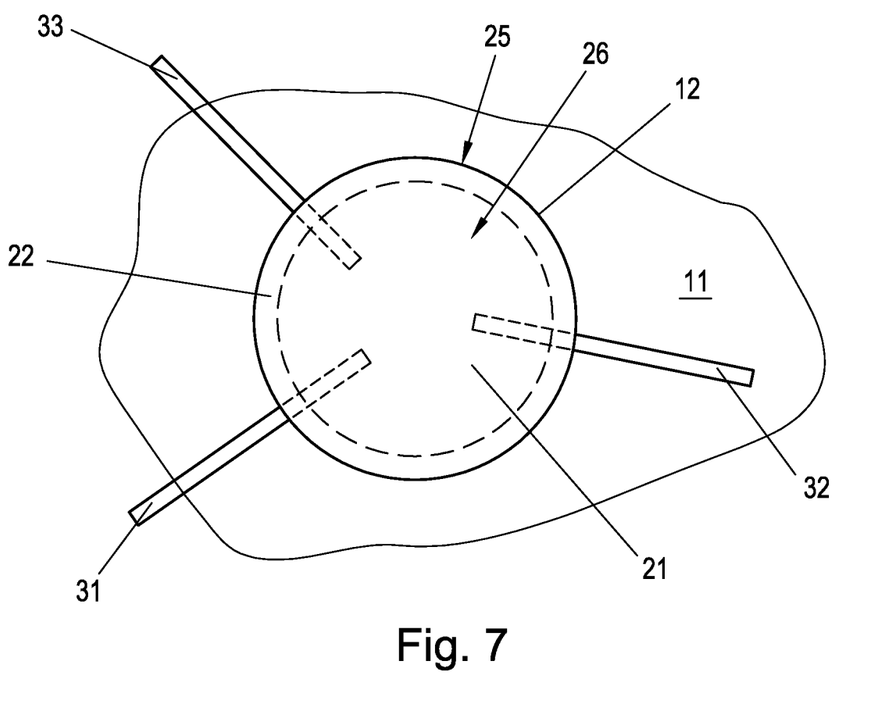
FIG. 7 shows a patch comprising different conductive and non-conductive regions of the thermal transfer adhesive.

The use of electrically conductive thermal transfer adhesive 21 and electrically non-conductive thermal transfer adhesive 22 on a patch 12 could, however, also be used for other purposes. For example, the outer edge of the patch 12 could form a region 25 comprising electrically non-conductive thermal transfer adhesive 22 continuously over the circumference, and within this outer continuous region 25, a region 26 comprising electrically conductive thermal transfer adhesive 21 could be provided, in which the required electrical connections are then produced, as indicated in FIG. 5 or FIG. 7. In this way, the inner electrically conductive region 26 can be electrically insulated from the outside by means of conductive thermal transfer adhesive 21, for example to protect against electrical contact being made unintentionally due to moisture. Such an outer region 25 made of electrically non-conductive thermal transfer adhesive 22 can also be used in an embodiment as described in conjunction with FIG. 3. In this context, the patch 12 itself in the region facing away from the carrier material 11 and/or the carrier material 11 at least in the region of the patch 12 can also be made waterproof in order to prevent unintentional electrical contact due to moisture there as well. This waterproof embodiment of a patch 12 can, of course, also be used in the other embodiments.

The thermal transfer adhesives 21, 22 in the various regions 25, 26, 27 are, as described for the embodiment according to FIG. 1, preferably applied to the patch 12 before the thermal transfer method is used, preferably in a printing process. The electrically conductive connections can be produced as in the embodiment according to FIG. 1, i.e., again by means of pressure and heat.

Figure 4:
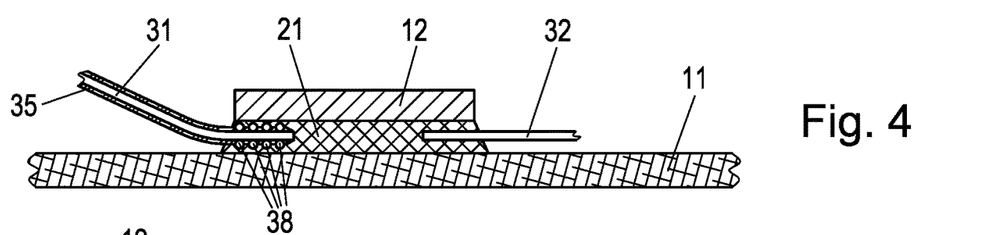
FIG. 4 shows a section through a patch comprising an electrically connected, insulated conductive element.

FIG. 4 shows a section through a patch 12 over a conductive element 31 which is additionally provided all around with electrical insulation 35 in the region of the thermal transfer adhesive 21. The conductive element 31, together with the insulation 35 thereof, can be a completely normal insulated wire, but the insulation 35 is made of a material that has a melting point in the order of magnitude of, or even slightly below, the reaction temperature of the thermal transfer adhesive 21. It is only necessary to ensure that the insulation 35 melts during the thermal transfer method. Before the patch 12 was applied to the carrier material 11, the conductive element 31 has been electrically insulated by the insulation 35. During the process of producing the electrical connection to a second conductive element 32 by means of the thermal transfer method in a thermal transfer press, however, the insulation 35 in the region of the thermal transfer adhesive 21 has been melted away and thus comes into electrical contact with the electrically conductive thermal transfer adhesive 21. At the usual pressure in thermal transfer pressing, the insulation 35 flows away in the heated region under the patch 12, such that an electrical connection can be produced despite the insulation 35. This would mean that the conductive element 31 would not have to be stripped before the electrical connection is produced, which significantly simplifies production.

The insulation 35 of the conductive element 31 is preferably made of a material which has a comparatively low melting point with regard to the thermal transfer adhesive. For example, polybutene is such a material. The melting point of polybutene is approx. 135° C. and the thermal transfer method can be carried out at 150° C., for example. If a conductive element 31 with a polybutene insulation is connected by means of a thermal transfer method, the insulation 35 of the conductive element 31 is melted away in the same work step.

The production of the electrical connection in FIG. 4 could be facilitated by arranging bare electrically conductive wires 38 between the conductive element 31 and the carrier material 11 and/or between the conductive element 31 and the patch 12, substantially transversely (at an angle of ≥25°, preferably 45 to 90°) to the conductive element 32. The wires 38 can be in the form of individual wires, or a wire mesh, or a wire woven fabric, or a wire grating. Because the wires 38 are not insulated, they have a very good electrical connection to the conductive thermal transfer adhesive 21. During the pressing process in the thermal transfer method, the wires 38 and the conductive element 31 are pressed together particularly strongly at specific points, as a result of which the melted insulation 35 is more effectively displaced in this region. The conductive element 31 can thereby attain a particularly good contact resistance to the wires 38 and thus also to the conductive thermal transfer adhesive 21.

The thermal transfer press for carrying out the thermal transfer method can be equipped so as to also generate a high-frequency magnetic field at least temporarily during the thermal transfer method in order to cause additional local heating at least in the region of an electrically insulated conductive element 31 and thereby even more effectively melt away the insulation from the conductive element 31 when the electrical connection is produced. To facilitate this, in the region of the insulation 35, an electrically conductive structure (e.g., as a film or as a print on the carrier material 11 or on a patch 12) made of a multitude of closed electrical conductors (e.g., wire rings or wire loops) can be provided in the region of the electrical connection to be produced. These closed conductors then form short-circuit rings in which the high-frequency magnetic field induces a current, which causes heating of the electrical conductors. Additional heat can thus be generated locally very precisely in order to melt the insulation 35. In this way, an insulation 35 could also be used of which the melting point is above the reaction temperature of the thermal transfer adhesive 21.

The use of insulated conductive elements 31 as described in FIG. 4 is, of course, also conceivable in each embodiment in FIGS. 1, 2, 3 and 5.

In the embodiment according to FIG. 5, in addition to conventional fibers 36 made of textile material, at least one electrically conductive fiber 34, e.g., in the form of a metal yarn or a metallized yarn, is incorporated into the textile carrier material 11. The electrically conductive fiber 34 thus forms an electrical conductive element 31, which is intended to be connected in an electrically conductive manner to a second conductive element 32 (either a wire, or the like, or the patch 12 itself) by means of the electrically conductive thermal transfer adhesive 21. In the thermal transfer method for producing the electrical connection, the thermal transfer adhesive 21 becomes viscous and is therefore also pressed into the textile carrier material 11 due to the pressure (of course, this also applies to the other embodiments in which this was not described or shown). The thermal transfer adhesive 21 thus also makes contact with the electrically conductive fiber 34 in the carrier material 11, by means of which an electrical connection to the other conductive element 32 can also be produced. Of course, this can also be used in other embodiments, e.g., according to FIG. 3.

Of course, with the electrical connection according to the invention, more than two conductive elements 31, 32 can also be electrically connected to one another by means of the electrically conductive thermal transfer adhesive 21, as shown in FIG. 7. In addition, the patch 12 could also be electrically conductive, as described.

For the invention, it is irrelevant where the conductive elements 31, 32 come from, how they are laid or arranged on the carrier element 11 or to what they are connected at the other end. These can also be laid freely or can be fastened to the carrier material 11 itself. An arrangement between two layers of a carrier material is, of course, also conceivable. How the conductive elements 31, 32 extend outside the electrical connection is not the subject of the invention. They could be incorporated into the textile carrier material 11, applied thereto (glued, stapled, sewn, or even applied by means of screen printing or similar methods), or not be connected to the textile carrier material 11 at all. In a particularly advantageous embodiment, at least one conductive element 31, 32 is printed, plotted or glued onto the carrier element 11 as a conductor track.

Figure 6:
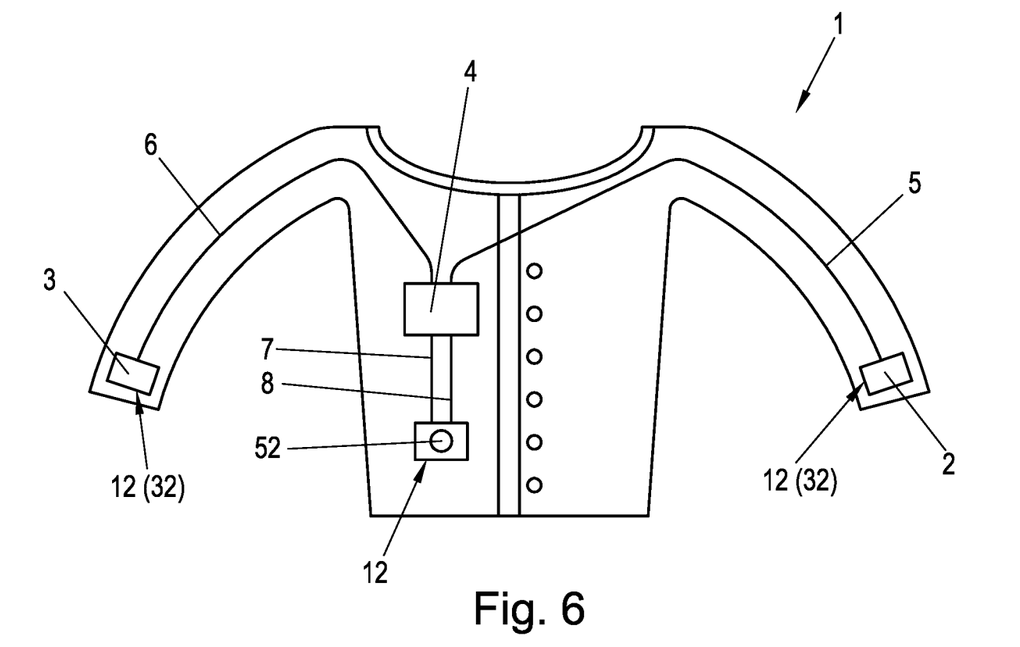
FIG. 6 shows an embodiment of a smart textile comprising electrical connections according to the invention.

FIG. 6 shows an example of an intelligent garment 1 (smart textile) comprising skin electrodes 2, 3 on the cuffs in order to tap an electrical skin potential. The skin electrodes 2, 3 are designed as an electrically conductive patch 12 as a conductive element 32 as described in FIG. 2. The two skin electrodes 2, 3 are connected to an evaluation unit 4 (microprocessor comprising software) by means of wires 5, 6 as conductive elements 31. The patch 12 (conductive element 32) and the wire 5, 6 (conductive element 31) are electrically connected, as described, by means of thermal transfer methods using an electrically conductive thermal transfer adhesive 21. On a further patch 12, a light-emitting diode 51 is arranged as described in FIG. 3, which is also connected to the evaluation unit 4 by means of wires 7, 8 (conductive element 31, 32). The electrical connection between the patch 12 and the wires 7, 8 and the design of the patch 12 are as described for FIG. 3. In this example, an electrical voltage between the two skin electrodes can be evaluated in the evaluation unit 4. If the voltage exceeds a predetermined limit value, this is indicated by the light-emitting diode 51. The intelligent garment 1 can be produced very easily and quickly.

In order to facilitate the production of an electrical connection, an adhesive that adheres at room temperature can be provided on the side of the patch 12 facing the carrier material 11 and/or on the side of the carrier material 11 facing the patch 12, in order to provisionally fix the patch 12 for the thermal transfer method. Such an adhesive is preferably only weakly adhesive and still adheres even after the patch 12 has been applied several times to the carrier material 11, in order to be able to align the patch 12 properly on the carrier material 11 in a simple manner. Such an adhesive is preferably not provided over the entire surface of the patch 12, but only partially and in a very small amount or grammage. Furthermore, such an adhesive preferably has a melting temperature which is below the melting temperature of the thermal transfer adhesive 21 in order not to influence the thermal transfer method and the production of the electrical connection.

The invention claimed is:

1. Electrically conductive connection between a first electrically conductive element and a second electrically conductive element on a textile carrier material, the electrically conductive connection comprising:
an electrically conductive thermal transfer adhesive arranged on the carrier material and configured and arranged to create an electrically conductive connection between the first conductive element and the second conductive element, and to be in electrically conductive contact with the first conductive element and the second conductive element;
wherein the second conductive element is a flat patch, and the patch has at least three regions on a side facing the carrier material, a first and a second region of the at least three regions provided with the electrically conductive thermal transfer adhesive and a third region of the at least three regions provided with electrically non-conductive thermal transfer adhesive.

2. The electrically conductive connection according to claim 1, further including a flat patch; and wherein the thermal transfer adhesive is positioned between the carrier material and the flat patch and respective ends of the conductive elements are arranged in a region of the thermal transfer adhesive between the carrier material and the flat patch.

3. The electrically conductive connection according to claim 2, further including at least one further conductive element arranged between the flat patch and the carrier material in the region of the thermal transfer adhesive.

4. The electrically conductive connection according to claim 2, further including a region on the outer edges of the patch with an electrically non-conductive thermal transfer adhesive, and which extends continuously over a circumference of the patch.

5. The electrically conductive connection according to claim 1, wherein the second conductive element is a flat patch, the thermal transfer adhesive provided between the carrier material and the flat patch, and an end of the first conductive element is arranged in a region of the thermal transfer adhesive between the carrier material and the flat patch, the flat patch configured and arranged to be electrically conductive on a side facing the thermal transfer adhesive.

6. The electrically conductive connection according to claim 5, further including at least one further conductive element arranged between the flat patch and the carrier material in the region of the thermal transfer adhesive.

7. The electrically conductive connection according to claim 5, characterized in that the flat patch is configured and arranged to be electrically conductive on the side facing away from the carrier material, and the electrically conductive side of the patch facing the carrier material is electrically coupled to the side of the patch facing away from the carrier material.

8. Patch for producing an electrically conductive connection between a first electrically conductive element and a second electrically conductive element on a textile carrier material, the patch comprising:
an electrically conductive thermal transfer adhesive arranged on a side of the patch;
wherein the thermal transfer adhesive includes at least three regions, a first and a second region of the at least three regions including electrically conductive thermal transfer adhesive and a third region of the at least three regions including electrically non-conductive thermal transfer adhesive;
characterized in that the first and the second electrically conductive regions are electrically insulated from one another by the third electrically non-conductive region.

9. The electrically conductive connection according to claim 1, characterized in that the first and the second regions of the second conductive element are electrically insulated from one another by the third region.

10. The electrically conductive connection according to claim 1, further including at least one electronic or electrical component including at least one first connection pin and second connection pin arranged on the patch, the first connection pin electrically coupled to the first electrically conductive region and the second connection pin electrically coupled to the second electrically conductive region.

11. The electrically conductive connection according to claim 1, wherein outer edges of the patch include a fourth region with an electrically non-conductive thermal transfer adhesive that extends continuously over the circumference of the patch.

12. The electrically conductive connection according to claim 1, further including electrical insulation encompassing at least one of the conductive elements is configured and arranged to be at least partially melted in a region of the electrically conductive thermal transfer adhesive.

13. The electrically conductive connection according to claim 12, wherein the electrically conductive thermal transfer adhesive includes an electrically conductive wire arranged substantially transversely to the conductive element positioned between the carrier material and the at least one conductive element and/or between the at least one conductive element and a patch, the conductive wire configured and arranged in electrical contact with the conductive element.

14. The patch according to claim 8, further including at least one electronic or electrical component having at least one first and second connection pin arranged on the patch, the first connection pin electrically coupled to the first electrically conductive region and the second connection pin electrically coupled to the second electrically conductive region.

15. The patch according to claim 8, characterized in that the patch is electrically conductive on a first side facing the thermal transfer adhesive.

16. The patch according to claim 15, characterized in that the patch is electrically conductive on a second side facing away from the thermal transfer adhesive and the electrically conductive side of the patch facing the thermal transfer adhesive is electrically coupled to the electrically conductive side of the patch facing away from the thermal transfer adhesive.

17. The patch according to claim 8, wherein outer edges of the patch include a region with an electrically non-conductive thermal transfer adhesive which extends continuously over the circumference of the patch.

\* \* \* \* \*